(12) United States Patent
Hill

(10) Patent No.: US 12,464,798 B2
(45) Date of Patent: Nov. 4, 2025

(54) TRANSISTOR WITH ALIGNED FIELD PLATE AND METHOD OF FABRICATION THEREFOR

(71) Applicant: NXP USA, Inc., Austin, TX (US)

(72) Inventor: Darrell Glenn Hill, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 578 days.

(21) Appl. No.: 17/646,451

(22) Filed: Dec. 29, 2021

(65) Prior Publication Data
US 2023/0207641 A1     Jun. 29, 2023

(51) Int. Cl.
| | |
|---|---|
| H10D 64/00 | (2025.01) |
| H01L 21/76 | (2006.01) |
| H01L 21/765 | (2006.01) |
| H10D 30/01 | (2025.01) |
| H10D 30/47 | (2025.01) |
| H10D 62/85 | (2025.01) |

(52) U.S. Cl.
CPC ........ H10D 64/111 (2025.01); H01L 21/7605 (2013.01); H01L 21/765 (2013.01); H10D 30/015 (2025.01); H10D 30/475 (2025.01); H10D 62/8503 (2025.01)

(58) Field of Classification Search
CPC ............ H01L 29/402; H01L 29/66462; H01L 29/7786; H10D 64/111; H10D 30/015; H10D 30/475
See application file for complete search history.

(56) References Cited

U.S. PATENT DOCUMENTS

| 6,593,197 | B2 | 7/2003 | Wieczorek | |
|---|---|---|---|---|
| 7,605,045 | B2 | 10/2009 | Peidous | |
| 9,343,572 | B1 * | 5/2016 | Lao | H01L 29/402 |
| 11,201,234 | B1 * | 12/2021 | Huang | H01L 29/66462 |
| 2005/0253168 | A1 * | 11/2005 | Wu | H10D 64/112 |
| | | | | 257/E29.253 |
| 2009/0267116 | A1 | 10/2009 | Wu et al. | |
| 2014/0061659 | A1 * | 3/2014 | Teplik | H01L 29/402 |
| | | | | 257/E21.403 |
| 2015/0144953 | A1 * | 5/2015 | Hill | H01L 29/7787 |
| | | | | 438/172 |

OTHER PUBLICATIONS

Herold, Selective Dry Etch for Defining Ohmic Contacts for High Performance ZnO TFTs, 2014 (Year: 2014).*
Williams, Etch Rates for Micromachining Processing—Part II, 2003 (Year: 2003).*

* cited by examiner

*Primary Examiner* — Britt D Hanley
*Assistant Examiner* — Casey Paul Boatman
(74) *Attorney, Agent, or Firm* — Sherry W. Gourlay

(57) ABSTRACT

A transistor device includes a semiconductor substrate and a gate structure at the upper surface of the substrate. The gate structure is non-planar and includes a metal gate electrode with first and second sidewalls. A first dielectric layer is present over the gate structure. The first dielectric layer includes a first portion that overlies the first sidewall and a second portion that overlies the second sidewall. A portion of a conductive layer over the first dielectric layer forms a field plate with a first portion proximate to the second sidewall of the gate structure. A dielectric sidewall spacer on the first portion of the field plate is formed from a portion of a second dielectric layer, and the dielectric sidewall spacer does not contact the first dielectric layer.

25 Claims, 12 Drawing Sheets

US 12,464,798 B2

TRANSISTOR WITH ALIGNED FIELD PLATE AND METHOD OF FABRICATION THEREFOR

TECHNICAL FIELD

Embodiments of the subject matter described herein relate generally to transistor devices, and more particularly to field plate structures of semiconductor power transistors.

BACKGROUND

High-power field effect transistor (FET) devices find application in a wide variety of electronic components and systems. Various advances have been made over the years to improve gain, efficiency, and other characteristics of power FETs that are used to provide amplification in radio frequency (RF) communication systems. For example, one such advance is to include a source-connected field plate in proximity to the gate of an RF power FET, which may facilitate an increased breakdown voltage and a reduced high-field trapping effect.

The length of the field plate is an important parameter for determining the overall characteristics and performance of an RF power FET. For example, as the operating frequency increases, the optimum field plate length decreases. As desired operational frequencies reach into the gigahertz (GHz) range, maintaining tight control of field plate dimensions and uniformity through conventional processing methods becomes increasingly challenging. The realities of alignment tolerance and critical dimension (CD) control, particularly in the presence of non-planar features such as those used in fabrication of contemporary RF power FETs, make it difficult to realize high-volume manufacturing for power FET devices capable of efficient high-voltage operation in the multiple-GHz range (e.g., at 10 GHz and beyond). Accordingly, transistor structures and processing methods are desired that enable precise control of field plate alignment and dimensions.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1A:
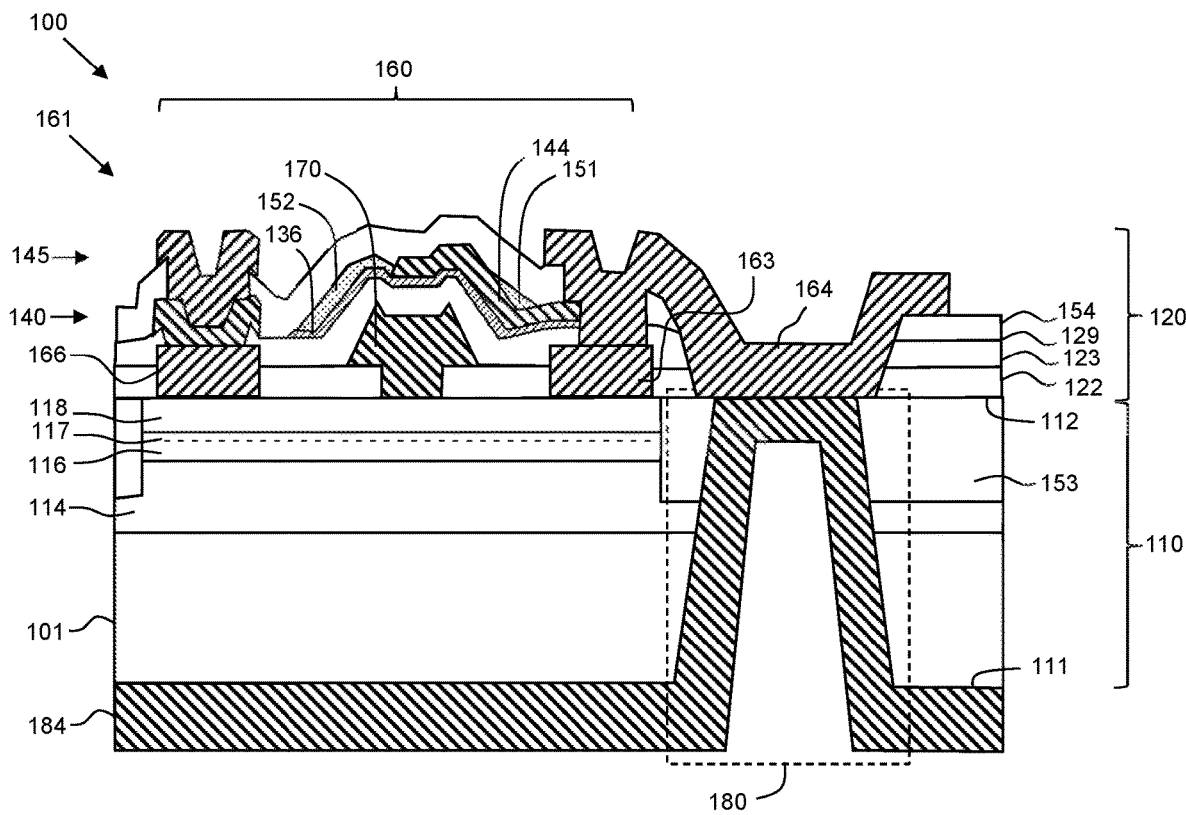
FIGS. 1A, 1B, 1C, and 1D are cross sectional side views of transistor devices in accordance with two embodiments.

Various embodiments of the inventive subject matter address the above challenges by providing a power transistor and an associated fabrication method in which the field plate placement and length are both self-aligned to the gate structure of a transistor, without dependence on alignment tolerance or CD control. In the below-described fabrication method embodiments, the position of the field plate with respect to the gate structure, as well as the length of the field plate, may be formed using a sidewall spacer that overlies the field plate, and without resorting to conventional photolithography processes currently used to form field plates. Essentially, in conjunction with an etching process, the overlying sidewall spacer functions as a hard mask to define the underlying field plate. This approach may significantly improve the reproducibility and manufacturability of high-frequency RF power transistors.

FIGS. 1A, 1B, 1C, and 1D are cross sectional side views of transistor devices in accordance with four embodiments. Starting first with FIG. 1A, a cross sectional side view of a transistor device 100 is depicted, in accordance with an embodiment. Transistor device 100 includes a semiconductor die comprising a base semiconductor substrate 110 and an overlying build-up structure 120. The substrate 110 is defined by an upper substrate surface 112 and a lower substrate surface 111, along with sidewalls that extend between the lower and upper substrate surfaces 111, 112. A plurality of additional electrical structures, patterned conductive layers, and dielectric layers are included in the build-up structure 120, which is connected to and overlies the upper surface 112 of the substrate 110.

In an embodiment, an active region 160 is defined within a portion of the substrate 110 and an overlying portion of the build-up structure 120. One or more isolation regions 153 may be defined within the substrate 110 at the upper surface 112, and the active region 160 corresponds to portions of the substrate 110 extending between such isolation regions 153.

In an embodiment, the semiconductor substrate 110 may include a host semiconductor substrate 101 and a plurality of layers overlying the host substrate 101. According to an embodiment, the plurality of layers overlying the host substrate 101 includes a buffer layer 114, a channel layer 116, and a barrier layer 118, all of which are described in more detail later in conjunction with FIG. 3.

In an embodiment, the build-up structure 120 is formed on and over the upper surface 112 of the substrate 110 and may include various electrical structures (e.g., gate electrode 170, source and drain electrodes 163, 166), a plurality of dielectric layers (e.g., dielectric layers 122, 123, 154), and a plurality of patterned conductive layers (e.g., interconnect metal layers 140, 145).

A transistor 161 is formed in the active region 160 of the device 100. In various embodiments, the transistor 161 is a field effect transistor (FET), which includes a gate electrode 170, a source electrode 163 proximate to but spaced apart from a first sidewall of the gate electrode 170, and a drain electrode 166 proximate to but spaced apart from a second sidewall of the gate electrode 170, all of which are present at the upper surface 112 of the substrate 110, and are formed in the build-up structure 120 overlying the substrate 110. In a more particular embodiment, the transistor 161 is a high electron mobility transistor (HEMT), although the transistor 161 may be another type of transistor, as well.

The source and drain electrodes 163, 166 (also referred to as first and second current-carrying electrodes) are formed at and over the upper surface 112 of the substrate 110. In some embodiments, the source and drain electrodes 163, 166 make ohmic contact with the substrate 110. More specifically, source electrode 163 and drain electrode 166 are formed laterally adjacent each other, and both of these electrodes 163, 166 extend through a surface passivation layer 122 (also referred to as a "dielectric layer" herein) to make contact with the upper surface 112 of the substrate 110. In addition, the source and drain electrodes 163, 166 are electromagnetically coupled to opposite ends of a channel 117, which is present within the substrate 110. The source electrode 163 is electrically coupled to a through substrate via (TSV) 180 through patterned portions of one or more of the interconnect metal layers 140, 145 of the build-up structure 120. The drain electrode 166 is electrically coupled to an output (not shown) of the device 100.

The TSV 180 extends from the lower surface 111 of the substrate 110 to and through the upper surface 112 of the substrate 110, passing through one of the above-mentioned isolation regions 153. A back metal layer 184, which is deposited on the lower surface 111 of the substrate 110 and onto the interior surfaces of TSV 180, is physically and electrically coupled to a portion 164 of a conductive interconnect metal layer 145, which in turn is electrically coupled to the source electrode 163. Accordingly, the source electrode 163 is electrically coupled to the back metal layer 184 through the portion of the interconnect metal layer 145. The back metal layer 184 may include an adhesion layer (not illustrated) that contacts the lower substrate surface 111 of the substrate 110, and a primary conductive layer that contacts the adhesion layer.

The gate electrode 170 (also referred to as a "control electrode") is a metallic structure, which also is electromagnetically coupled to the channel 117. According to an embodiment, the metal gate electrode 170 extends through the surface passivation layer 122 to contact the upper surface 112 of the substrate 110 between the source and drain electrodes 163, 166. In some embodiments, the gate electrode 170 includes a Schottky contact connected to the substrate 110.

The build-up structure 120 includes the surface passivation layer 122 formed on the upper surface 112 of the substrate 110, along with multiple additional dielectric and conductive layers described below. As mentioned above, each of the source and drain electrodes 163, 166 and the gate electrode 170 extend through openings in the surface passivation layer 122 to contact the upper surface 112 of the substrate 110 at various points above the channel 117. In an embodiment, the surface passivation layer 122 (and other dielectric layers 123, 154, discussed below) may have a thickness in a range of about 100 angstroms to about 10,000 angstroms, although other thickness values may be used. In other embodiments, each of the dielectric layers 122, 123, 154 may have thickness values in the range of about 500 angstroms to about 5,000 angstroms, although other thickness values may be used. Further, according to an embodiment, each of the dielectric layers 122, 123, 154 are formed from a dielectric material, such as silicon nitride, silicon oxide, silicon oxynitride, or other suitable materials.

A patterned first dielectric layer 123 overlies the surface passivation layer 122, the source and drain electrodes 163, 166, and the gate electrode 170. According to various embodiments, the first dielectric layer 123 is formed from a dielectric material that includes an insulating etch stop material (e.g., aluminum oxide (AlOx)) or other suitable materials), and/or an etch stop material layer (e.g., layer 129, FIGS. 6-10) is present at the upper surface of the first dielectric layer 123. As will be described in more detail later in conjunction with FIG. 10, the etch stop material (and/or the etch stop material layer) has a significantly lower etch rate in a dry etch chemistry than both a first conductive layer (e.g., layer 130, FIGS. 7-10) deposited over the first dielectric layer 123, and a sacrificial second dielectric layer (e.g., dielectric layer 150, FIG. 9) deposited over the first conductive layer, as described below.

As will be described in detail later, a conductive field plate 136 is formed from portions of a first conductive layer (e.g., layer 130, FIGS. 7-10) that overlies the first dielectric layer 123 in proximity to the gate electrode 170. The field plate 136 is formed from a first conductive material (e.g., titanium tungsten (TiW), titanium tungsten nitride (TiWN), tungsten silicide (WSi), or other suitable materials). As will also be described in detail below, the field plate 136 is formed during an etching process that etches away portions of an overlying dielectric layer (e.g., layer 150, FIG. 9) and portions of the conductive layer (e.g., layer 130, FIGS. 7-10), where remaining portions of the overlying dielectric layer function as a hard mask to enable fully self-aligning the field plate 136 to the gate electrode 170. As shown in FIGS. 1A-1D, at least some portions of the conductive layer 130 from which the field plate 136 is formed overlie the gate electrode 170, and thus are proximate to the sidewalls and the upper surface (e.g., sidewalls 173, 175 and upper surface 174, FIGS. 5A-5D) of the gate electrode 170, with portions of the first dielectric layer 123 being present between the field plate 136 and the gate electrode 170.

A patterned first interconnect metal layer 140 is present over the field plate 136 and the first dielectric layer 123. The first interconnect metal layer 140 is formed from a second conductive material (e.g., titanium, nickel, gold, platinum, a combination thereof, or other suitable materials), which is or may be different from the first conductive material from which the field plate 136 is formed. Separate portions of the first interconnect metal layer 140 make contact with each of the source electrode 163, the drain electrode 166, and the gate electrode 170 through openings in the first dielectric layer 123. Further, some of those portions of the first interconnect metal layer 140, referred to herein as conductive "straps" 144, are present on and/or electrically connected to the field plate 136, and the conductive strap(s) 144 extend to and electrically connect with the source electrode 163. According to an embodiment, in some locations along the conductive layer 130 from which the field plate 136 is formed, the conductive strap(s) 144 may extend at least partially over the gate electrode 170, as shown in the cross-sectional views of FIGS. 1A-1D. According to another embodiment, a conductive strap instead or also may be located at or beyond the end of the gate electrode 170 that is farthest from the input end of the gate electrode 170. For example, the strap may have a "U" shape that is parallel with the plane of the top substrate surface 112, and that connects the portion of the field plate 136 on the drain side of the gate electrode 170 (e.g., the portion of field plate 136 on the left side of the gate electrode 170 in FIG. 11) to either or both of the source electrode 163 and/or the portion of the field plate 136 on the source side of the gate electrode 170 (e.g., the portion of the field plate 136 on the right side of the gate electrode 170 in FIG. 11). In other locations along the field plate 136, such as those illustrated in FIGS. 11 and 12, neither the conductive layer 130 nor portions of the first interconnect metal layer 140 extend over the gate electrode 170. Instead, in these locations, the field plate 136 instead may be adjacent to one or both sidewalls 173, 175 of the gate electrode 170.

As discussed in detail later, portions 151, 152 of a second dielectric layer (e.g., dielectric layer 150, FIG. 9), also referred to herein as "overlying sidewall spacers," are present on the field plate 136 and on portions of the conductive straps 144. Essentially, in conjunction with an etching process, these overlying sidewall spacers 151, 152 function as a hard mask to define the underlying field plate 136.

A third dielectric layer 154 of the build-up structure 120 is present over portions of the first interconnect metal layer 140 the field plate 136, and the conductive straps 144. A second interconnect metal layer 145 is present over the third dielectric layer 154. Separate portions of the second interconnect metal layer 145 are either directly electrically coupled to each of the source electrode 163, the drain electrode 166, and the gate electrode 170 through openings in the second and third dielectric layers 123, 154, or are electrically coupled through portions of the first interconnect metal layer 140 to each of the source electrode 163, the drain electrode 166, and the gate electrode 170 through openings in the third dielectric layer 154. According to an embodiment, one of those portions 164 of the second interconnect metal layer 145 is electrically coupled to and extends from the source electrode 163 to the portion of the upper surface 112 of the substrate 110 where the innermost end of the TSV 180 is located. Accordingly, the source electrode 163, the conductive strap 144, and the field plate 136 are electrically coupled to the TSV 180 and to the back metal layer 184.

In the embodiment of FIG. 1A, the gate structure essentially includes the gate electrode 170. In several other embodiments of transistor devices, such as those illustrated in FIGS. 1B, 1C, and 1D, the gate structure may include additional features that may improve device performance. For example, referring now to FIG. 1B, a transistor device 100' is illustrated, which includes all of the features described above in conjunction with transistor device 100 (FIG. 1A), along with a modified gate structure, according to another embodiment. For purposes of brevity, the above description of the features of transistor device 100 (FIG. 1A) are not repeated here, but are intended to be incorporated into this description of the transistor device 100' of FIG. 1B.

More particularly, the gate structure of transistor device 100' includes the above-described metal gate electrode 170, along with a gate insulating layer 178 on the metal gate electrode 170, where the edges of the metal gate electrode 170 and the gate insulating layer 178 essentially match (i.e., the gate insulating layer 178 is present on the gate electrode 170, but not on dielectric layer 122). In some embodiments, and as will be described in more detail later in conjunction with FIG. 5B, the gate insulating layer 178 may include a material layer (e.g., the upper portion of the conductive material of the gate electrode 170), which has been converted from a conducting material into an insulating layer (e.g., via an oxidation, nitridation, or other suitable process). In other embodiments, the gate insulating layer 178 may include a layer of insulating material that is deposited on the material of the gate electrode 170 as part of forming the gate structure. Capacitive coupling between the field plate 136 and the channel 117 is a desired characteristic of device 100', but parasitic capacitance between the field plate 136 and the gate electrode 170 (or the gate-to-source capacitance $C_{GS}$) is not desirable. Including the gate insulating layer 178 provides a way to increase the dielectric thickness between the gate electrode 170 and the field plate 136 without increasing the dielectric thickness between the field plate 136 and the channel 117 in the semiconductor substrate 110. By increasing the dielectric thickness between the gate electrode 170 and the field plate 136, the gate insulating layer 178 may significantly reduce parasitic capacitance between the gate electrode 170 and the overlying field plate 136 without decreasing the capacitive coupling between the field plate 136 and the channel 117, and thus may improve the gain and unity current gain frequency ($f_T$) of the device 100'.

Figure 1B:
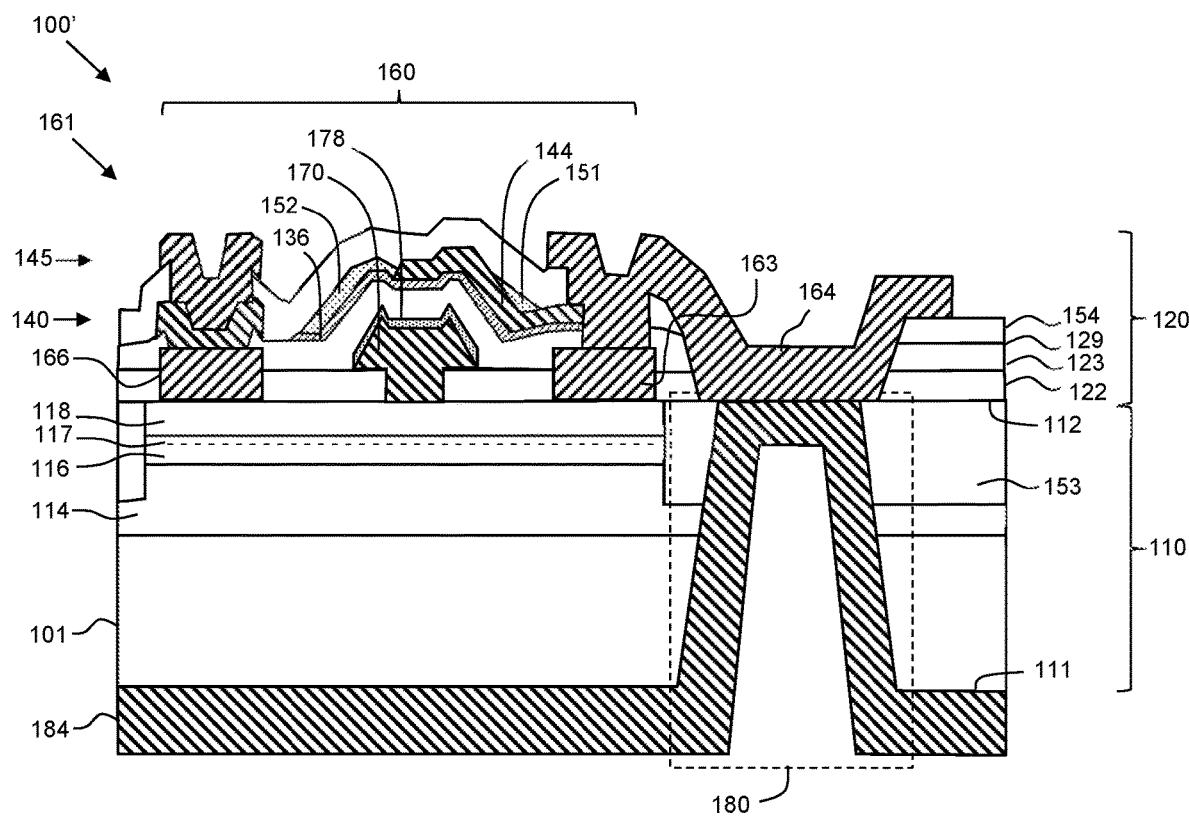
Figure 1C:
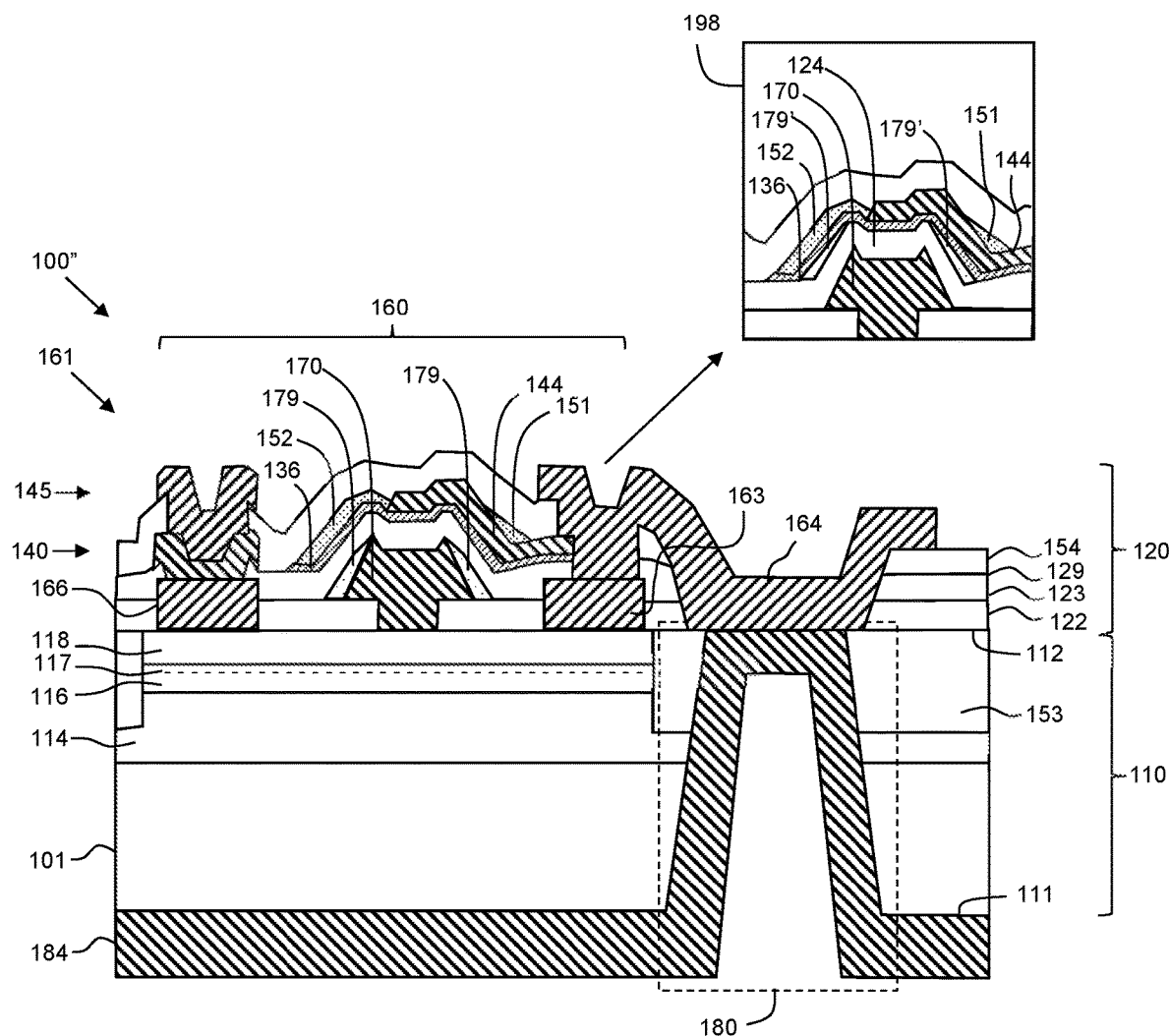

According to yet another embodiment, and as depicted in FIG. 1C, a transistor device 100" is illustrated, which includes all of the features described above in conjunction with transistor device 100 (FIG. 1A), along with sidewall spacers 179 coupled to the sidewalls (e.g., sidewalls 173, 175, FIG. 5C) of the gate electrode 170. For purposes of brevity, the above description of the features of transistor device 100 (FIG. 1A) are not repeated here, but are intended to be incorporated into this description of the transistor device 100" of FIG. 1C.

More particularly, the gate structure of transistor device 100" includes the above-described metal gate electrode 170, along with sidewall spacers 179 on both sidewalls of the metal gate electrode 170. Similar to the gate insulating layer 178 described above in conjunction with FIG. 1B, the sidewall spacers 179 may significantly reduce parasitic capacitance between the gate electrode 170 and the overlying field plate 136, and thus may improve the gain and $f_T$ of the device 100".

According to an alternate embodiment of the device 100" of FIG. 1C, and as shown in box 198 in the upper right corner of FIG. 1C, sidewall spacers 179' alternatively may be coupled to non-horizontal "sidewalls" of the portion of dielectric layer 123, rather than being coupled to the gate electrode 170. More specifically, the sidewall spacers 179' may be formed between dielectric layer 123 and field plate 136 on the non-horizontal portions of dielectric layer 123 that are adjacent to the sidewalls (e.g., sidewalls 173, 175, FIG. 5C) of the gate electrode 170.

Figure 1D:
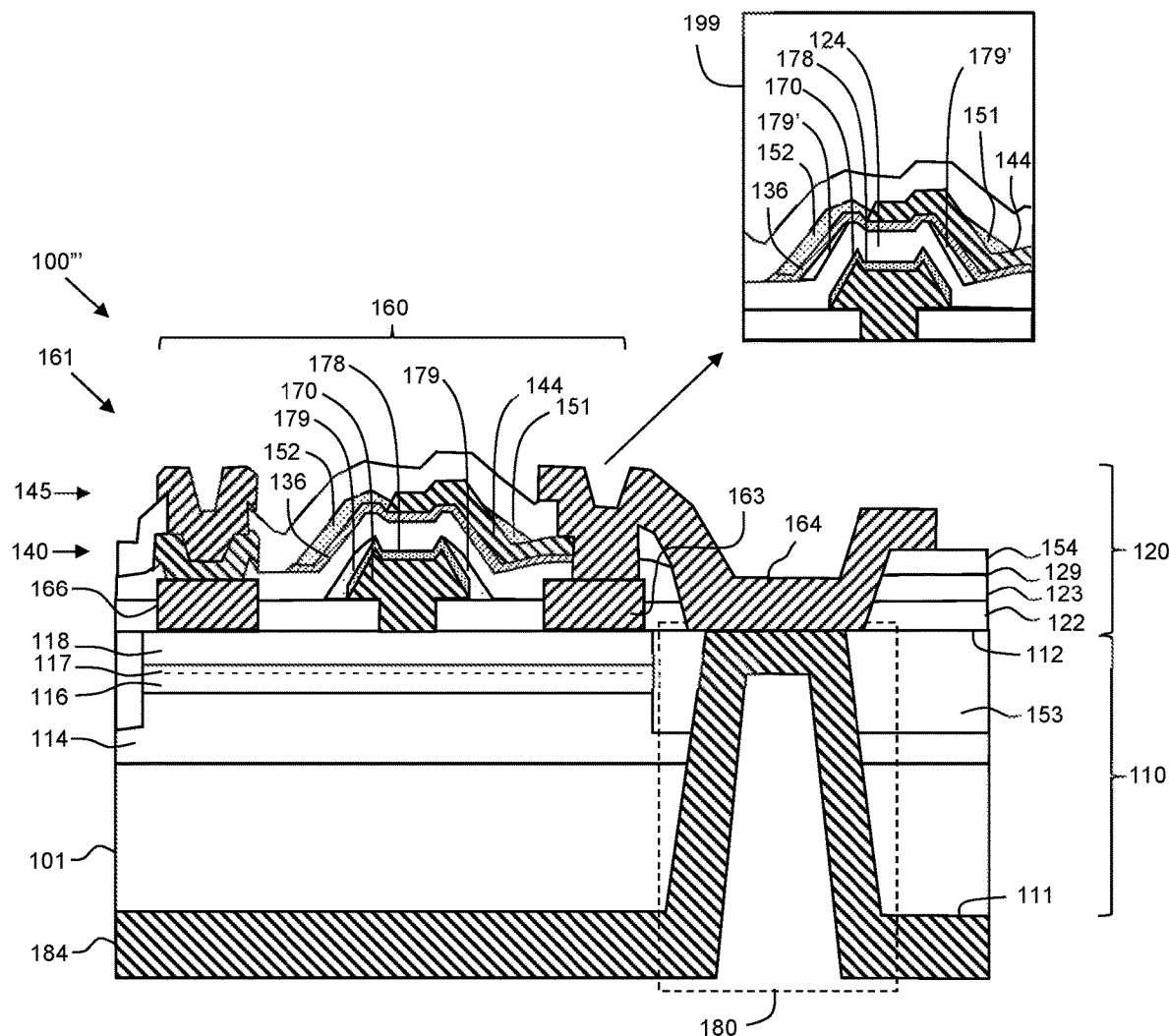

According to yet another embodiment, and as depicted in FIG. 1D, a transistor device 100''' is illustrated, which includes all of the features described above in conjunction with transistor device 100 (FIG. 1A), along with the gate dielectric layer 178 described in conjunction with FIG. 1B and the sidewall spacers 179 described in conjunction with FIG. 1C. For purposes of brevity, the above description of the features of transistor device 100 (FIG. 1A) are not repeated here, but are intended to be incorporated into this description of the transistor device 100''' of FIG. 1D.

More particularly, the gate structure of transistor device 100''' includes the above-described metal gate electrode 170, along with a gate insulating layer 178 on the metal gate electrode 170, and sidewall spacers 179 on portions of the gate insulating layer 178 at both sidewalls of the metal gate electrode 170. As described above in conjunction with FIG. 5B, the gate insulating layer 178 may include a material layer that has been converted from a conducting material into an insulating layer, or the gate insulating layer 178 may include a layer of insulating material that is deposited on the gate electrode 170 as part of forming the gate structure, in various embodiments. Further, as described above the combination of the gate insulating layer 178 and the sidewall spacers 179 may significantly reduce parasitic capacitance between the gate electrode 170 and the overlying field plate 136, and thus may improve the gain and $f_T$ of the device 100'''.

According to an alternate embodiment of the device 100''' of FIG. 1D, and as shown in box 199 in the upper right corner of FIG. 1D, sidewall spacers 179' alternatively may be coupled to non-horizontal "sidewalls" of the portion of dielectric layer 123, rather than being coupled to the gate insulating layer 178 of the gate structure. More specifically, the sidewall spacers 179' may be formed between dielectric layer 123 and field plate 136 on the non-horizontal portions of dielectric layer 123 that are adjacent to the sidewalls (e.g., sidewalls 173, 175, FIG. 5D) of the gate electrode 170.

Figure 2:
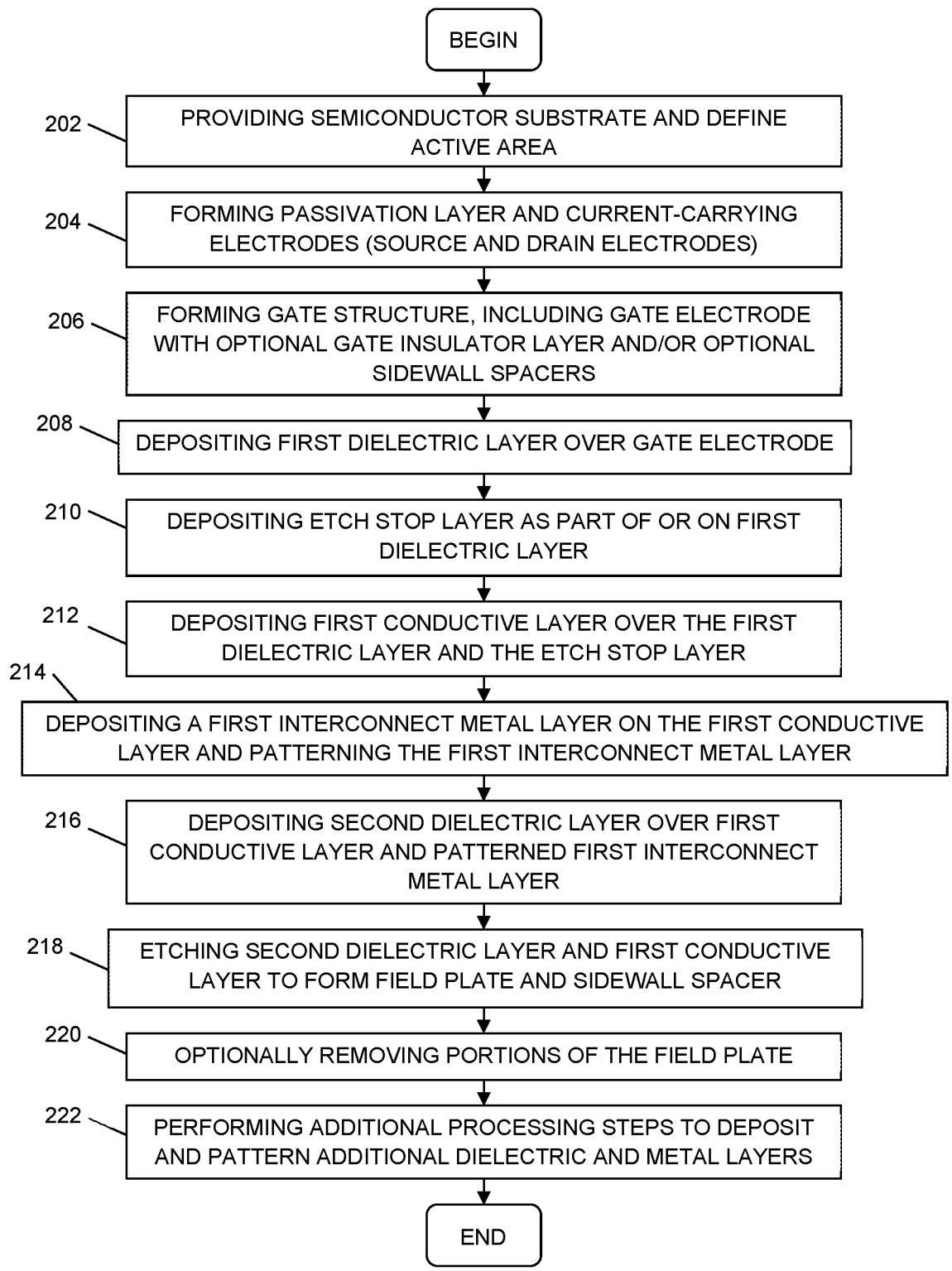
FIG. 2 is a process flow diagram describing a method for fabricating the devices of FIGS. 1A and 1B in accordance with an embodiment.

FIG. 2 is a process flow diagram depicting a method for fabricating the devices of FIGS. 1A, 1B, 1C, and 1D, in accordance with various embodiments. For enhanced understanding, FIG. 2 should be viewed simultaneously with FIGS. 3, 4, 5A, 5B, 5C, 5D, and 6-12, which are cross sectional views depicting the devices of FIGS. 1A, 1B, 1C, and 1D at various stages of fabrication in accordance with various embodiments.

Figure 3:
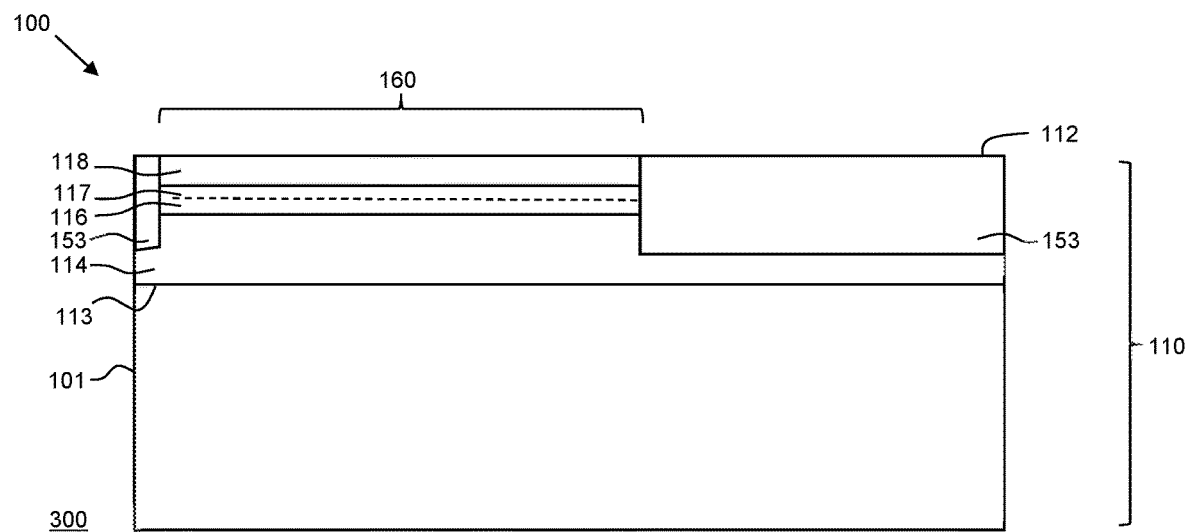
FIGS. 3, 4, 5A, 5B, 5C, 5D, 6, 7, 8, 9, 10, 11, and 12 are cross sectional views depicting the devices of FIGS. 1A, 1B, 1C, and 1D at various stages of fabrication in accordance with various embodiments.
Figure 4:
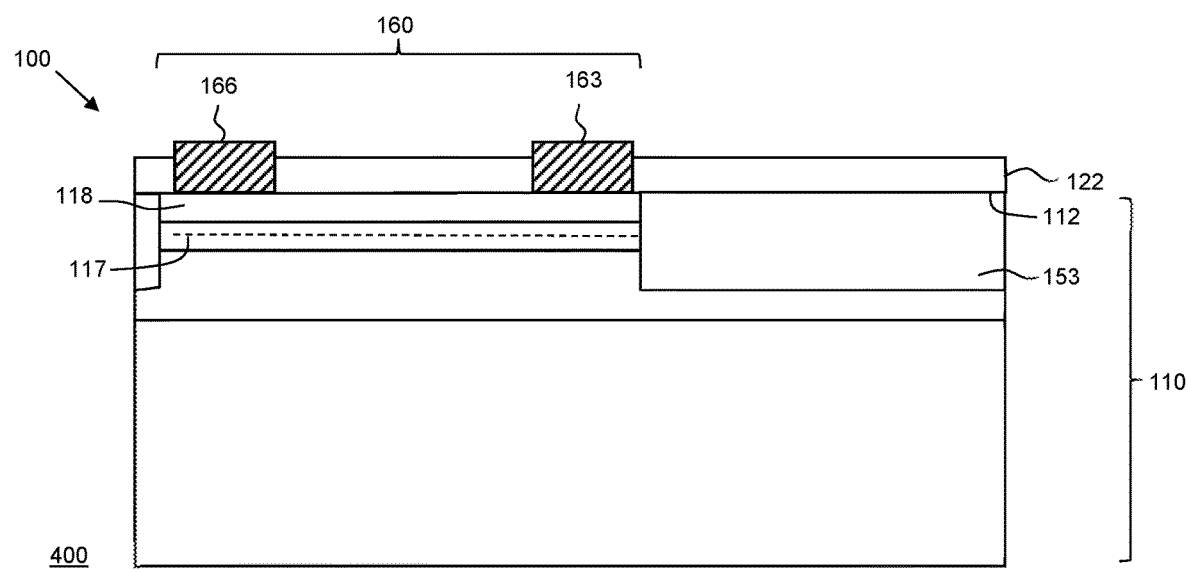

Referring first to step 202 and FIG. 3, at a first stage of fabrication 300, a semiconductor substrate 110 is provided, and an active area 160 is defined in the semiconductor substrate 110. As mentioned previously, the semiconductor substrate 110 may include a host semiconductor substrate 101 ("host substrate") and a plurality of layers overlying the host substrate 101. According to an embodiment, the plurality of layers overlying the host substrate 101 includes a buffer layer 114, a channel layer 116, and a barrier layer 118.

In an embodiment, the host substrate 101 includes an upper surface 112 and may be formed from silicon carbide (SiC). In other embodiments, the host substrate 101 may include other materials such as sapphire, silicon (Si), gallium nitride (GaN), aluminum nitride (AlN), diamond, boron nitride (BN), poly-SiC, silicon on insulator, gallium arsenide (GaAs), indium phosphide (InP), and other substantially insulating or high resistivity materials.

The buffer layer 114 may be formed on the upper surface 112 of host substrate 101. The buffer layer 114 may include one or more group III-N semiconductor layers. In some embodiments, the buffer layer 114 includes multiple layers of semiconductor material, wherein each of the layers of buffer layer 114 may include an epitaxially grown group-III nitride layer, for example. The epitaxially grown group-III nitride layers that make up buffer layer 114 may include nitrogen (N)-polar (i.e., N-face) or gallium (Ga)-polar (i.e., Ga-face) material, for example. In other embodiments, the semiconductor layer(s) of the buffer layer 114 may not be epitaxially grown. In still other embodiments, the semiconductor layer(s) of the buffer layer 114 may include Si, GaAs, InP, or other suitable materials.

The buffer layer 114 may include at least one AlGaN mixed crystal layer having a composition denoted by $Al_XGa_{1-X}N$ with an aluminum mole fraction, X, that can take on values between 0 and 1. The total thickness of buffer layer 114, including all of its constituent layers, may be between about 100 angstroms and about 100,000 angstroms although other thicknesses may be used. A limiting X value of 0 yields pure GaN while a value of 1 yields pure aluminum nitride (AlN). In an embodiment, the buffer layer 114 may include a nucleation region comprised of AlN. The nucleation region starts at the interface between the host substrate 101 and buffer layer 114, and extends about 100 angstroms to about 1000 angstroms into buffer layer 114. The buffer layer 114 may include additional $Al_XGa_{1-X}N$ layers formed over the nucleation region. The thickness of the additional $Al_XGa_{1-X}N$ layer(s) may be between about 100 angstroms and about 50,000 angstroms though other thicknesses may be used. In an embodiment, the additional $Al_XGa_{1-X}N$ layer(s) may be configured as GaN layer(s) (X=0) where the $Al_XGa_{1-X}N$ layer(s) are not intentionally doped (NID). Alternatively, the additional $Al_XGa_{1-X}N$ layer(s) may be configured as one or more GaN layers where the one or more GaN layers are intentionally doped with dopants that may include iron (Fe), chromium (Cr), carbon (C) or other suitable dopants that render buffer layer 114 substantially insulating or high resistivity. The dopant concentration may be between about $10^{17}$ cm$^{-3}$ and $10^{19}$ cm$^{-3}$ though other higher or lower concentrations may be used. The additional $Al_XGa_{1-X}N$ layers may be configured with X=0.01 to 0.10 where the $Al_XGa_{1-X}N$ is NID or, alternatively, where the $Al_XGa_{1-X}N$ is intentionally doped with Fe, Cr, C, a combination of these, or other suitable dopant species. In other embodiments, the additional layers may be configured as a superlattice where the additional layers include a series of alternating NID or doped $Al_XGa_{1-X}N$ layers where the value of X takes a value between 0 and 1. In still other embodiments, buffer layer 114 may include one or more indium gallium nitride (InGaN) layers, with composition denoted $In_YGa_{1-Y}N$, where Y, the indium mole fraction, may take a value between 0 and 1. The thickness of the InGaN layer(s) may be between about 10 angstroms and about 1000 angstroms though other thicknesses may be used.

In an embodiment, the channel layer 116 may be formed over buffer layer 114. The channel layer 116 may include one or more group III-N semiconductor layers. The channel layer 116 may include an $Al_XGa_{1-X}N$ layer where X takes on values between 0 and 1. In an embodiment, the channel layer 116 is configured as GaN (X=0) although other values of X may be used without departing from the scope of the inventive subject matter. The thickness of the channel layer 116 may be between about 50 angstroms and about 10,000 angstroms, though other thicknesses may be used. The channel layer 116 may be NID or, alternatively, may include Si, Ge, C, Fe, Cr, or other suitable dopants. The dopant concentration may be between about $10^{16}$ and about $10^{19}$ cm$^{-3}$ though other higher or lower concentrations may be used. In other embodiments, channel layer 116 may include NID or doped $In_YGa_{1-Y}N$, where Y, the indium mole fraction, may take a value between 0 and 1.

The barrier layer 118 may be formed over the channel layer 116, in accordance with an embodiment. The barrier layer 118 may include one or more group III-N semiconductor layers. The barrier layer 118 may have a larger bandgap and/or larger spontaneous polarization than the channel layer 116 and, when the barrier layer 118 is over channel layer 116, the channel 117 may be created in the form of a two dimensional electron gas (2-DEG) within channel layer 116 adjacent the interface between the channel layer 116 and the barrier layer 118. In addition, tensile strain between the barrier layer 118 and channel layer 116 may cause additional piezoelectric charge to be introduced into the 2-DEG and the channel 117. The barrier layer 118 may include a multi-layer structure, where the first layer of the barrier layer 118 may include at least one NID $Al_XGa_{1-X}N$ layer where X takes on values between 0 and 1. In some embodiments, X may take a value of 0.1 to 0.35, although other values of X may be used. The thickness of the first layer of the barrier layer 118 may be between about 50 angstroms and about 1000 angstroms though other thicknesses may be used. The barrier layer 118 may be NID or, alternatively, may include Si, Ge, C, Fe, Cr, or other suitable dopants. The dopant concentration may be between about $10^{16}$ and $10^{19}$ cm$^{-3}$ though other higher or lower concentrations may be used.

There may be an additional AlN interbarrier layer (not shown) formed between the channel layer 116 and the barrier layer 118, in some embodiments. The AlN interbarrier layer may introduce additional spontaneous and piezoelectric polarization, increasing the channel charge and improving the electron confinement of the resultant 2-DEG that forms the channel 117.

In other embodiments, the barrier layer 118 may include one or more indium aluminum nitride (InAlN) layers, denoted $In_YAl_{1-Y}N$, where Y, the indium mole fraction, may take a value between about 0.1 and about 0.2 though other values of Y may be used. In the case of using InAlN to form the barrier layer 118, the thickness of the barrier layer 118 may be between about 50 angstroms and about 1000 angstroms though other thicknesses may be used. In the case of using InAlN to form the barrier layer 118, the InAlN may be NID or, alternatively, may include Si, Ge, C, Fe, Cr, or other suitable dopants. The dopant concentration may be between about $10^{16}$ cm$^{-3}$ and about $10^{19}$ cm$^{-3}$ though other higher or lower concentrations may be used.

A cap layer (not shown) may be formed over the barrier layer 118. When included, the cap layer presents a stable surface for the substrate 110 and serves to protect the upper surface 112 from chemical and environmental exposure incidental to wafer processing. The cap layer may include one or more group III-N semiconductor layers and is supported by barrier layer 118. In an embodiment, the cap layer includes GaN. The thickness of the cap layer may be between about 5 angstroms and about 100 angstroms though other thicknesses may be used. The cap layer may be NID or, alternatively, may include Si, Ge, C, Fe, Cr, or other suitable dopants. The dopant concentration may be between about $10^{16}$ cm$^{-3}$ and $10^{19}$ cm$^{-3}$ though other higher or lower concentrations may be used.

The isolation regions 153 may be formed via an implantation procedure configured to damage the epitaxial and/or other semiconductor layers to create high resistivity regions of the substrate 110, rendering the substrate 110 high resistivity or semi-insulating in the high resistivity regions while leaving the crystal structure intact in the active region 160. In other embodiments (not shown), one or more isolation regions 153 may be formed by removing one or more of the epitaxial and/or other semiconductor layers of the substrate 110 in areas corresponding to the isolation region(s) 153, and leaving behind active region "mesas" surrounded by high resistivity or semi-insulating isolation regions 153.

The transistor structure 161 (FIG. 1) may then be formed within the active region 160. Referring next to step 204 and FIG. 4, during a next stage of fabrication 400, a surface passivation layer 122 (e.g., a dielectric layer formed from silicon nitride, silicon oxide, or silicon oxynitride) is formed on the upper surface 112 of the semiconductor substrate 110, and conductive current-carrying electrodes, such as source and drain electrodes 163, 166 (e.g., ohmic contacts), are formed in the active region 160 of the device 100 over the channel 117. More specifically, openings corresponding to the locations of the source and drain electrodes 163, 166 are formed through the surface passivation layer 122, and the source and drain electrodes 163, 166 are then formed in the openings. As discussed previously, the source and drain electrodes 163, 166 contact the upper surface 112 of the substrate 110 over opposite ends of the channel 117, and the source and drain electrodes 163, 166 may be electromagnetically coupled to the channel 117 through the upper substrate surface 112 and the barrier layer 118. In other embodiments, the source and drain electrodes 163, 166 may be recessed through the upper substrate surface 112 and extend partially into or completely through the barrier layer 118, increasing the electrical coupling of the source and drain electrodes 163, 166 to the channel 117 through the barrier layer 118. In still other embodiments, ohmic contact regions may be formed by implanting a dopant species (e.g., Si) into the substrate 110. In some embodiments, low work function or other suitable materials may be combined with highly conductive materials in a metal stack to form the source and drain electrodes 163, 166, resulting in relatively low resistance contacts to the channel 117. Accordingly, a multi-stack metal layer (e.g., Ti, Al and or other suitable materials) may be deposited and annealed to form the source and drain electrodes 163, 166.

Figure 5A:
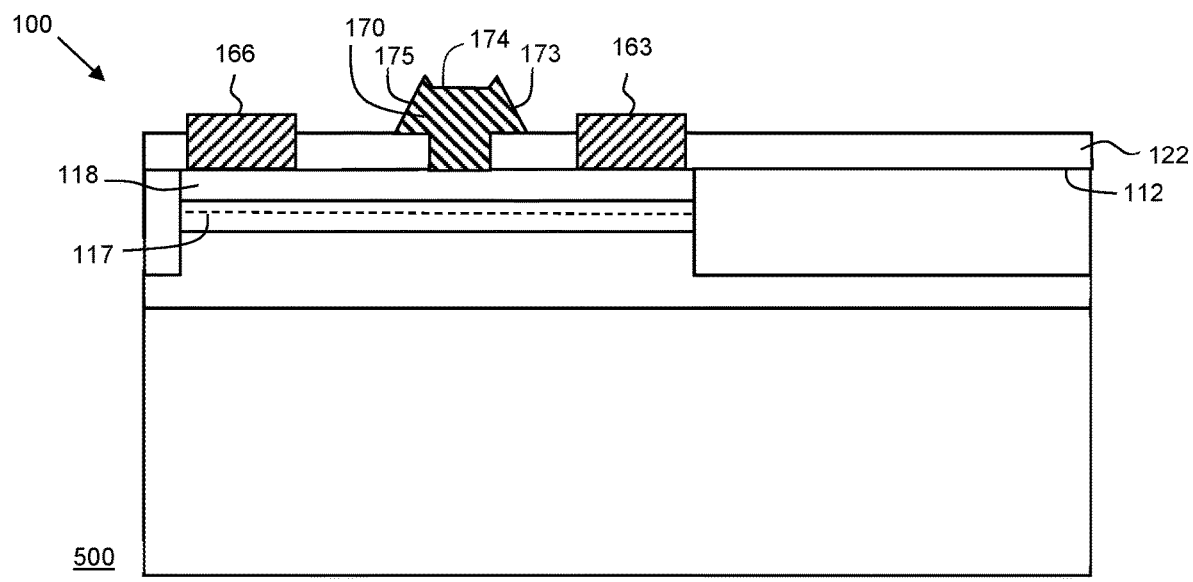
Figure 5B:
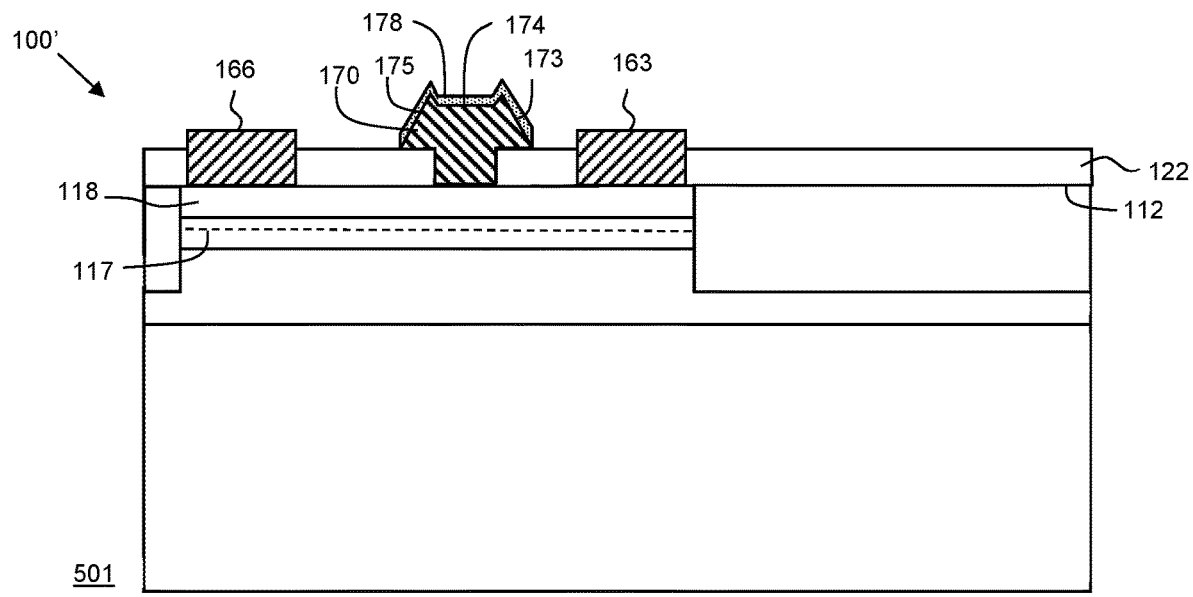
Figure 5C:
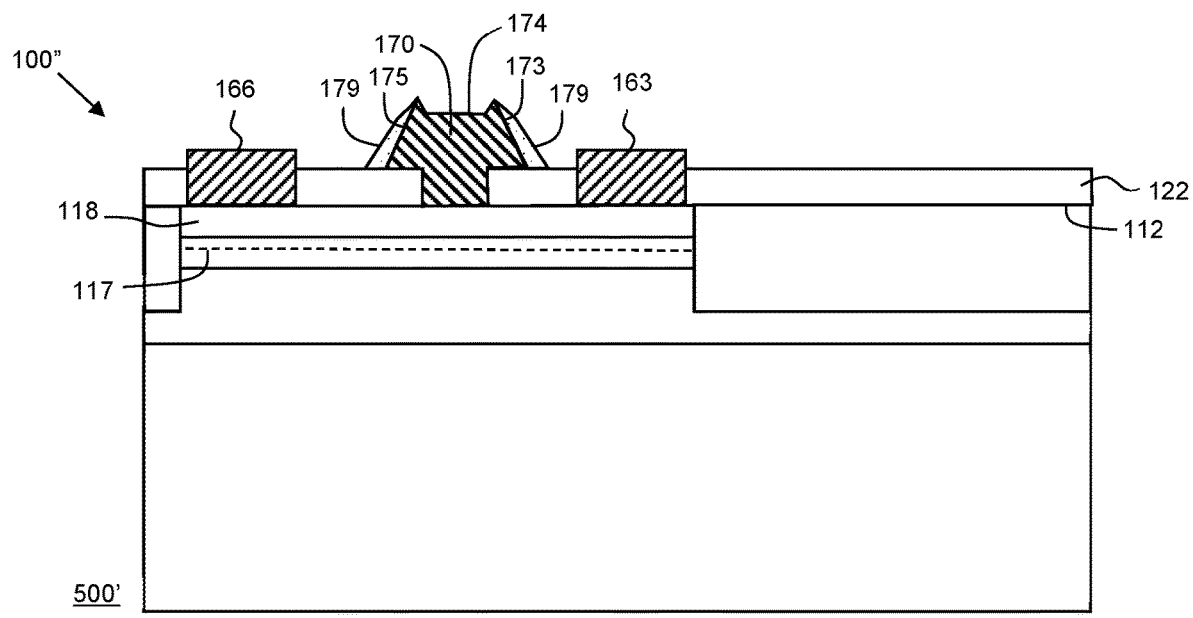
Figure 5D:
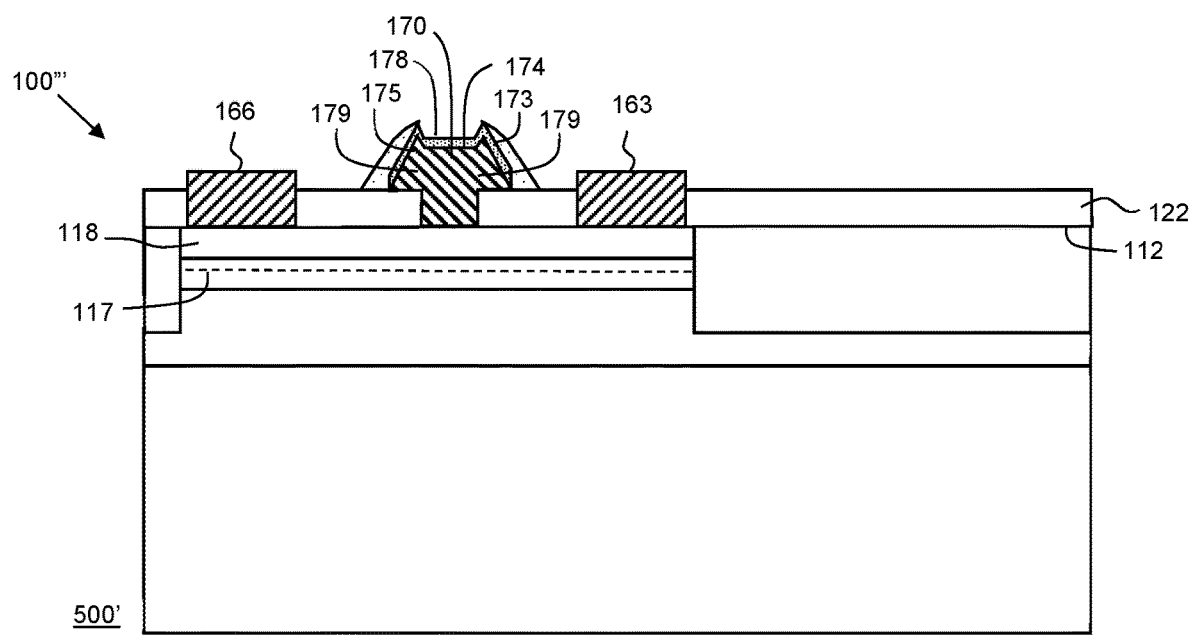

Referring next to step 206 and FIG. 5A, during a next stage of fabrication 500, the gate structure, including a metal gate electrode 170 (e.g., "control electrode"), may be formed over the substrate 110 in the active region 160. The gate electrode 170 may be electromagnetically coupled to the channel 117 through the upper substrate surface 112 and the barrier layer 118. During operation of the device 100, changes to the electric potential on gate electrode 170 may shift the quasi Fermi level for the barrier layer 118 compared to the quasi Fermi level for the channel layer 116 and thereby modulate the electron concentration in the channel 117 within the portion of the substrate 110 under the gate electrode 170.

In an embodiment, the gate electrode 170 may be configured as a Schottky gate and may be formed over and directly in contact with the upper substrate surface 112 using a Schottky material layer and a conductive metal layer. More specifically, Schottky or other suitable materials may be combined with highly conductive materials in a metal stack to form gate electrode 170, according to an embodiment. For example, a Schottky material layer may first be formed in contact with the substrate 110, and a conductive low-stress metal may be deposited over the Schottky material layer to form the gate electrode 170, according to an embodiment. In other embodiments, the gate electrode 170 may be formed over a gate dielectric or gate oxide (not illustrated) on the surface 112 of the substrate 110, thus forming a metal-insulator-semiconductor (MIS) junction or metal oxide semiconductor (MOS) junction, which is electrically coupled to the channel 117 through the gate dielectric or gate oxide layer.

The gate electrode 170 may have a T-shaped cross section, as shown in FIG. 5A, with a vertical stem over the substrate 110 that passes through the surface passivation layer 122, and a wider portion over the vertical stem that has horizontal portions that overlie and contact the upper surface of the surface passivation layer 122, according to an embodiment. In other embodiments (not shown), the gate electrode 170 may have a square or rounded cross-sectional shape. Either way, the gate electrode 170 is a non-planar structure that is partially defined a first sidewall 173, a second sidewall 175, and an upper surface 174 extending between the first and second sidewalls. In other embodiments, the vertical stem or lower portion of the gate electrode 170 may be recessed through the upper substrate surface 112 and may extend partially into the barrier layer 118, increasing the electrical coupling of gate electrode 170 to channel 117 through the barrier layer 118. The gate metal comprising all of part of the gate electrode 170 may be deposited by evaporation or another suitable process.

As mentioned above, and referring to FIG. 5B, in some embodiments (e.g., the embodiment depicted in FIG. 1B), forming the gate structure also may include an optional step of depositing or forming an insulating material layer 178 (also referred to as a "gate insulating layer") at the exposed surfaces of the metal gate electrode 170, according to several example embodiments. For example, in an optional fabrication stage 501 (FIG. 5B), when the gate electrode 170 is formed using an additive deposition process, a photoresist mask may be used to deposit the gate electrode 170, and a final layer 178 deposited (e.g., using a same photoresist mask) on the exposed surface of the metal gate electrode 170 may include an insulating material layer. For example, the insulating material layer 178 may include a layer of silicon dioxide, silicon nitride, silicon monoxide, boron oxide, boron nitride, and/or another suitable insulating material.

In another embodiment, rather than depositing an insulating material layer over the gate electrode 170 to provide the insulating layer 178, as described above, the top portion of the gate electrode 170 (or a top surface of a layer from which electrode 170 is formed) may be rendered insulating through a processing step, which results in the creation of the insulating layer 178. For example, in some embodiments, while performing step 206, a top layer of the evaporated material used to form gate electrode 170 may include a material that is suitable to be converted into an insulating material through an oxidation, nitridation, or other process. Accordingly, in some embodiments, a top layer of the gate electrode 170 formed during step 206 may include titanium, aluminum, boron, silicon, or another suitable material. This top layer, which corresponds to an exposed top surface of the gate electrode 170 (as seen in FIG. 5A) is converted into a layer 178 of insulating material. For example, an oxidation or nitridation process may be performed in step 206, which causes the exposed top portion of the gate electrode 170 to oxidize or nitridize, thus being rendered insulating. According to an embodiment, the oxidation or nitridation process includes exposing the device 100', and in particular the bare surface of the gate electrode 170, to an oxygen- or nitrogen-containing environment. The process may result in layer 178 becoming a layer of titanium dioxide, aluminum oxide, boron oxide, boron oxynitride, silicon monoxide, silicon dioxide, silicon oxynitride, or another suitable insulating material.

In yet another embodiment, forming the gate structure may include a subtractive deposition process. The subtractive deposition process includes:

blanket depositing a gate metal layer over the substrate (e.g., including a Schottky material layer and a conductive metal layer);

blanket depositing an insulating material layer on the gate metal layer (e.g., silicon dioxide, silicon nitride, silicon monoxide, boron oxide, and boron nitride), or blanket depositing and subsequently converting an upper material layer (e.g., titanium, aluminum, boron, and silicon) into an insulating layer (e.g., titanium dioxide, aluminum oxide, boron oxide, boron oxynitride, silicon monoxide, silicon dioxide, and silicon oxynitride), as described above; and using a photoresist mask to protect portions of the gate metal layer and the overlying insulating material layer where the gate structure is to be formed, and etching the exposed portions of the gate metal layer and insulating material layer, resulting in a gate electrode 170 and an insulating material layer 178 over the gate electrode 170.

Regardless of how the insulating material layer 178 is formed, the insulating material layer 178 may have the effect of reducing parasitic capacitance between the gate electrode 170 and the (subsequently formed) field plate, without decreasing desired capacitive coupling between the field plate and the channel.

As mentioned above, and referring to FIG. 5C, in some embodiments (e.g., the embodiment depicted in FIG. 1C), forming the gate structure also may include an optional step of forming dielectric sidewall spacers 179 on the first and second sidewalls 173, 175 of the metal gate electrode 170. Forming the sidewall spacers 179 includes forming a dielectric layer (not illustrated) over the gate electrode 170, and subsequently performing an etching process to remove portions of the dielectric layer, except for those portions that are coupled to the first and second sidewalls 173, 175. For example, the dielectric layer associated with the sidewall spacers 179 may comprise silicon nitride, silicon oxide, silicon oxynitride, tetraethyl orthosilicate (TEOS), or other suitable materials. The etching process is performed until the dielectric sidewalls spacers 179 have been reduced to a desired thickness over the first and second sidewalls 173, 175 of the metal gate electrode 170.

According to an alternate embodiment, and as discussed in conjunction with FIG. 1C and shown in box 198 in the upper right corner of FIG. 1C, sidewall spacers 179' alternatively may be coupled to non-horizontal "sidewalls" of the portion of subsequently-formed dielectric layer 123, rather than being coupled to the gate electrode 170.

As mentioned above, and referring to FIG. 5D, in some embodiments (e.g., the embodiment depicted in FIG. 1D), forming the gate structure also may include both optional steps of forming the insulating material layer 178 at the exposed surfaces of the metal gate electrode 170, as described above in conjunction with FIG. 5B, and subsequently forming dielectric sidewall spacers 179 on the insulating layer 178 adjacent the first and second sidewalls 173, 175 of the metal gate electrode 170, as described above in conjunction with FIG. 5C.

According to an alternate embodiment, and as discussed in conjunction with FIG. 1D and shown in box 199 in the upper right corner of FIG. 1D, sidewall spacers 179' alternatively may be coupled to non-horizontal "sidewalls" of the portion of subsequently-formed dielectric layer 123, rather than being coupled to the insulating material layer 178 of the gate structure.

Subsequent steps of the fabrication process, described below, may be performed on any of the embodiments of partially-formed transistor devices 100, 100', 100", and 100'" depicted in FIG. 5A, 5B, 5C, or 5D. For the purpose of brevity, these subsequent steps are illustrated (in FIGS. 6-12) and described below as being performed on the embodiment of the partially-formed transistor device 100 illustrated in FIG. 5A. However, those of skill in the art would understand, based on the description herein, that the subsequent steps described below may be performed identically on any of the embodiments of partially-formed transistor devices 100', 100", or 100'" illustrated in FIG. 5B, 5C, or 5D, which ultimately will yield the transistor devices 100', 100", 100'" illustrated in FIG. 1B, 1C, or 1D, respectively.

Because the next stages of fabrication pertain particularly to processing steps performed in proximity to the metal gate electrode 170, the remaining FIGS. 6-12 include enlarged depictions of the metal gate electrode 170. Those of skill in the art would understand, based on the description herein, that some of the various layers depicted in FIGS. 6-12 and described below may extend to the left and the right to abut or contact the source and/or drain electrodes 163, 166.

Figure 6:
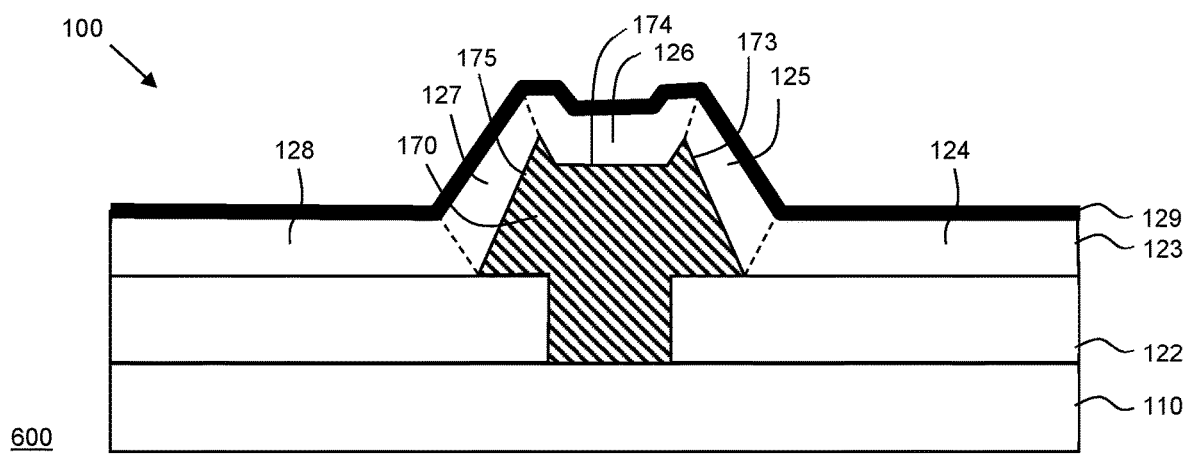

Referring next to steps 208 and 210 and FIG. 6, during a next stage of fabrication 600, a first dielectric layer 123 is deposited over the surface passivation layer 122, the metal gate electrode 170, and the source and drain electrodes 163, 166. In embodiments in which an insulating material layer 178 and/or dielectric sidewall spacers 179 are formed at the surface of the metal gate electrode 170, the first dielectric layer 123 also is formed over the insulating material layer 178 and/or dielectric sidewall spacers 179.

The first dielectric layer 123 may be formed from silicon nitride, silicon oxide, silicon oxynitride or other suitable dielectric materials. For ease of description, the first dielectric layer 123 may be considered to have several distinct abutting but integrally-formed portions, including a first portion 124 that extends toward the first-current carrying contact 163 (FIG. 5A), a second portion 125 that overlies the first sidewall 173 of the gate electrode 170, a third portion 126 that overlies the upper surface 174 of the gate electrode 170, a fourth portion 127 that overlies the second sidewall 175 of the gate electrode 170, and a fifth portion 128 that extends toward the second current-carrying contact 166 (FIG. 5A). According to an embodiment, the first dielectric layer 123 has a thickness in a range of about 500 angstroms to about 10,000 angstroms, although the first dielectric layer 123 may be thinner or thicker, as well.

According to an embodiment, either as part of the deposition process for the first dielectric layer 123 or after the first dielectric layer 123 is deposited, an etch stop material and/or etch stop layer 129 is deposited. The etch stop layer 129 or material includes a dielectric material (e.g., aluminum oxide or other suitable materials) that is characterized by a significantly lower etch rate in a dry etch chemistry, which will be later applied in block 218, described below, than a subsequently formed first conductive interconnect layer 140 and a sacrificial second dielectric layer 150, which are described below in conjunction with blocks 214 and 216 and illustrated in FIGS. 8 and 9. In some embodiments, the etch stop material may be included within a layer stack comprising the first dielectric layer 123, while in other embodiments, the etch stop layer 129 may be a final deposited insulating layer.

Figure 7:
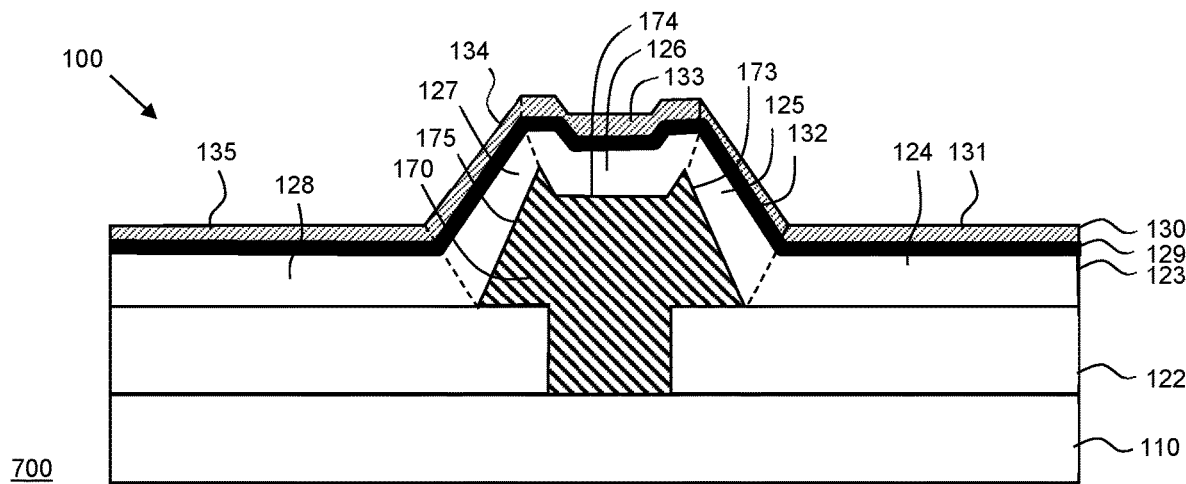

Referring next to step 212 and FIG. 7, during a next stage of fabrication 700, a first conductive layer 130 is deposited over the first dielectric layer 123 and the etch stop layer 129 or material. As will be explained below, the first conductive layer 130, once etched during a subsequent processing step (block 218), will correspond to the field plate 136 of device 100.

The first conductive layer 130 is formed from a material that is dry-etchable with respect to the underlying first dielectric layer 123, according to an embodiment. More specifically, the first conductive layer 130 may be formed from a first conductive material, such as TiW, TiWN, WSi, or other suitable materials. The first conductive layer 130 has a thickness in a range of about 100 angstroms to about 5000 angstroms, although the first conductive layer 130 may be thinner or thicker, as well. For ease of description, the first conductive layer 130 may be considered to have several distinct abutting but integrally-formed portions, including a first portion 131 that overlies portion 124 of dielectric layer 123 and extends toward the first-current carrying contact 163 (FIG. 5A), a second portion 132 that overlies portion 124 of dielectric layer 123 and the first sidewall 173 of the gate electrode 170, a third portion 133 that overlies portion 126 of dielectric layer 123 and the upper surface 174 of the gate electrode 170, a fourth portion 134 that overlies portion 127 of dielectric layer 123 and the second sidewall 175 of the gate electrode 170, and a fifth portion 135 that overlies portion 128 of dielectric layer 123 and extends toward the second current-carrying contact 166 (FIG. 5A).

Figure 8:
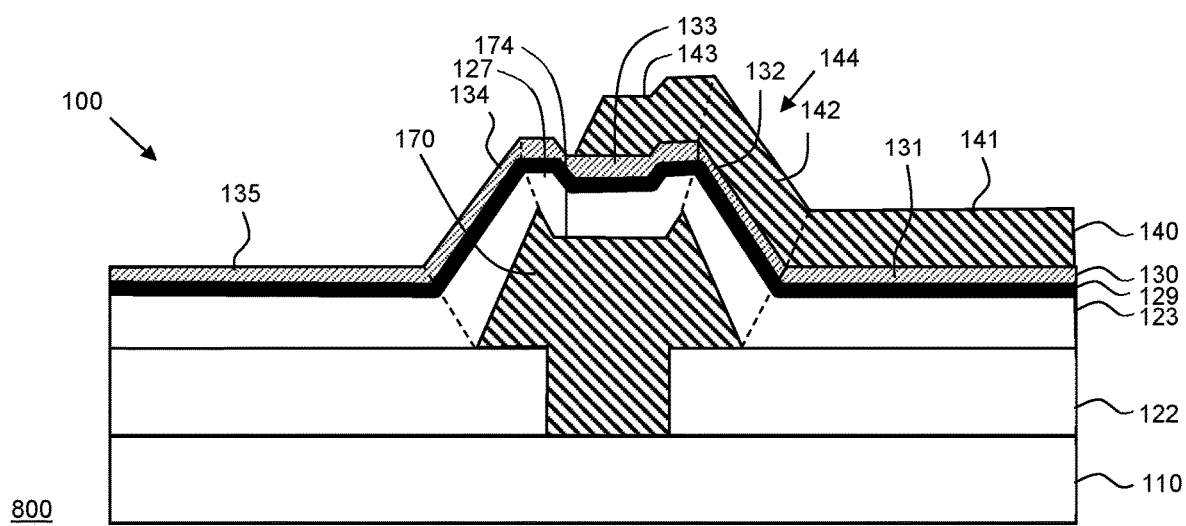

Referring next to step 214 and FIG. 8, during a next stage of fabrication 800, a first interconnect metal layer 140 is deposited on or over the first conductive layer 130, and the first interconnect metal layer 140 is patterned. For example, an additive or subtractive conductive layer patterning process may be used to pattern the first interconnect metal layer 140 so as to define a conductive structure that electrically connects to the first conductive layer 130 (and subsequently formed field plate 136, FIG. 10), and which also facilitates electrical connection between the subsequently formed field plate 136 (FIG. 10) and the source electrode 163 and/or back metal layer 184. More specifically, the first interconnect metal layer 140 may be patterned to form one or more conductive straps 144 proximate to the gate electrode 170, where each conductive strap 144 at least partially overlies the gate electrode 170. For ease of description, the conductive strap 144 may be considered to have several distinct abutting but integrally-formed portions, including a first portion 141 that overlies portion 131 of the first conductive layer 130 and portion 124 of dielectric layer 123 and extends toward the first-current carrying contact 163 (FIG. 5A), a second portion 142 that overlies portion 132 of the first conductive layer 130, portion 124 of dielectric layer 123, and the first sidewall 173 of the gate electrode 170, and a third portion 143 that overlies portion 133 of the first conductive layer 130, portion 126 of dielectric layer 123, and the upper surface 174 of the gate electrode 170.

The first interconnect metal layer 140 is formed from a second conductive material (e.g., titanium, nickel, gold, platinum or other suitable materials) that is different from the first conductive material from which the first conductive layer 130 (and the subsequently formed field plate 136, FIG. 10) is formed. According to an embodiment, the second conductive material of the first interconnect metal layer 140 has substantial etch selectivity relative to the first conductive material from which the first conductive layer 130 is formed.

Figure 9:
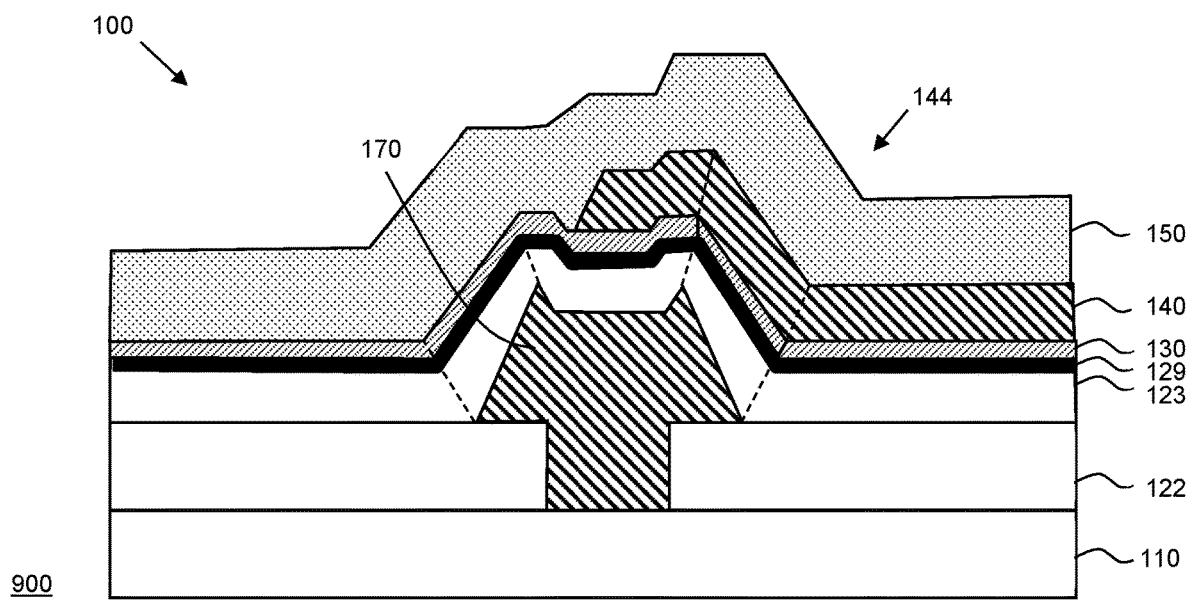

Referring next to step 216 and FIG. 9, during a next stage of fabrication 900, a substantially conformal second dielectric layer 150 (also referred to as a "sacrificial" dielectric layer) is formed on or over the first interconnect metal layer 140 and exposed portions of the first conductive layer 130. According to an embodiment, the second dielectric layer 150 includes a dielectric material such as silicon nitride, silicon oxide, silicon oxynitride, or other suitable materials, and the second dielectric layer 150 has a thickness in a range from about 500 angstroms to about 10,000 angstroms, when it is deposited. According to a further embodiment, an etch selectivity ratio for the second dielectric layer 150 to the first conductive layer 130 may be about 2:1, for example, although the etch selectivity ratio may be different, as well.

Figure 10:
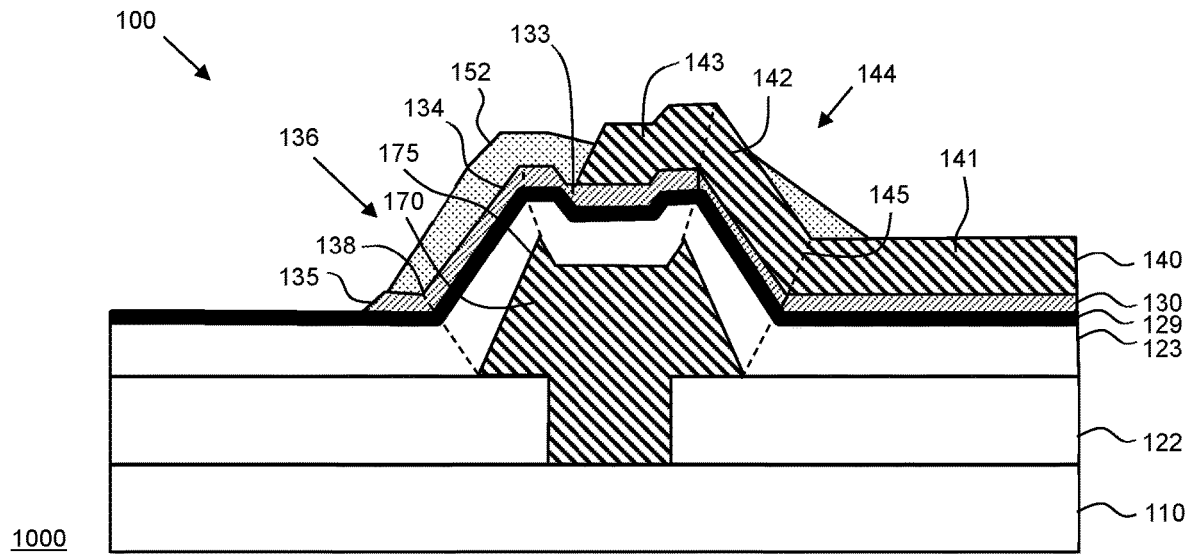

Referring next to step 218 and FIG. 10, during a next stage of fabrication 1000, an etching process (e.g., a dry etching process with modest overetch) is performed to remove significant portions of the second dielectric layer 150 and the underlying first conductive layer 130. More specifically, and according to an embodiment, a highly anisotropic etch is performed to remove substantial portions of the second dielectric layer 150 and subsequently exposed portions of the first conductive layer 130 that are not protected by the conductive strap 144 or remaining portions of the second dielectric layer 150. The etching process results in the removal of portions (but not all) of the second dielectric layer 150 and the first conductive layer 130 all the way down to the etch stop layer 130, particularly resulting in removal of substantially all material over planar regions of the device 100.

Over non-planar regions of the device 100, such as regions proximate to the sidewalls 173, 175 of the gate electrode 170, the etching process results in the formation of sidewall spacers 151, 152 corresponding to remaining portions of the second dielectric layer 150. As mentioned above, the sidewall spacers 151, 152 essentially function as a hard mask to protect portions of the first conductive layer 130 that correspond to the field plate 136.

Still referring to FIG. 10, a first sidewall spacer 152 remaining after the etching process is terminated protects at least portions 134 and 135 of the first conductive layer 130 proximate to an intersection 138 between portions 134 and 135. The first sidewall spacer 152 also may protect a part of portion 133 of the first conductive layer 130 that is not otherwise protected by conductive strap 144 (or more particularly, not protected by the upper portion 143 of conductive strap 144). Accordingly, the etching process results in a first part of the field plate 136 that includes and is proximate to the intersection 138 between portions 134 and 135 of the first conductive layer 130 (i.e., proximate to the drain-electrode side of the gate electrode 170). According to an embodiment, this first part of the field plate 136 is proximate to the second sidewall 175 of the gate electrode 170 along substantially the entire length of the gate electrode 170.

Figure 11:
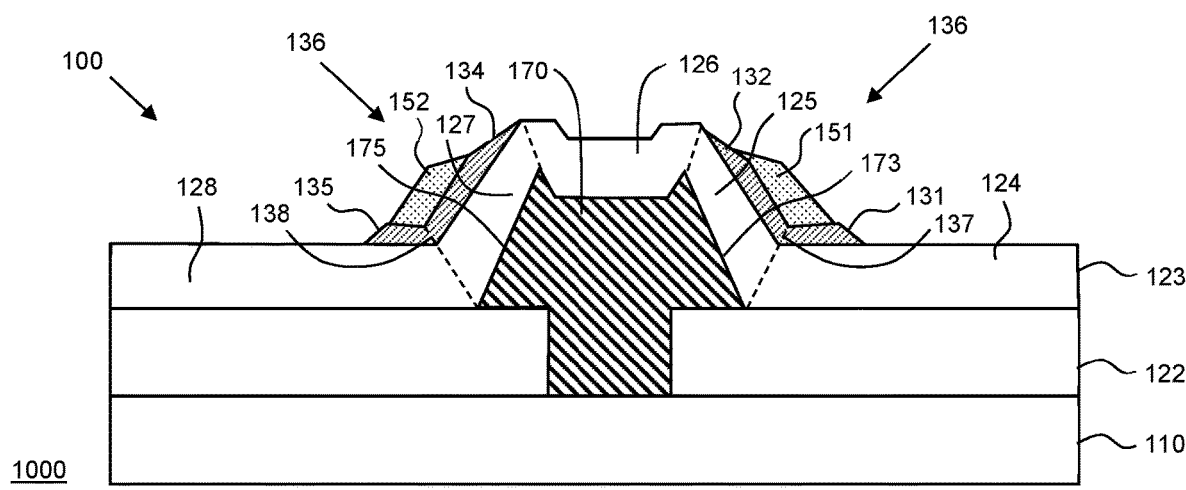

Further, an additional remaining portion of the second dielectric layer 150 may remain on the conductive strap 144 at an intersection 146 between portions 141 and 142 of the conductive strap 144. Referring now to FIG. 11, which is a cross-section through the device 100 at a point along the gate electrode 170 where the conductive strap 144 is not present, this additional remaining portion of the second dielectric layer 150 also extends onto and protects portions 131, 132 of the first conductive layer 130 proximate to an intersection 137 between portions 131 and 132 of the first conductive layer 130, thus providing a second sidewall spacer 151 proximate to the source-electrode side of the gate electrode 170. Given the presence of the second sidewall spacer 151, the etching process results in a second part of the field plate 136 that is proximate to the intersection 137 between portions 131 and 132 of the first conductive layer 130, and thus that is proximate to the first sidewall 173 of the gate electrode 170. It may be noted at this point that the above-referenced first and second portions of the field plate 136 (i.e., the portions proximate both the first and second sidewalls 173, 175 of the gate electrode 170) all are electrically connected through the portion 133 of the first conductive layer 130 that is protected by the conductive strap 144.

Figure 12:
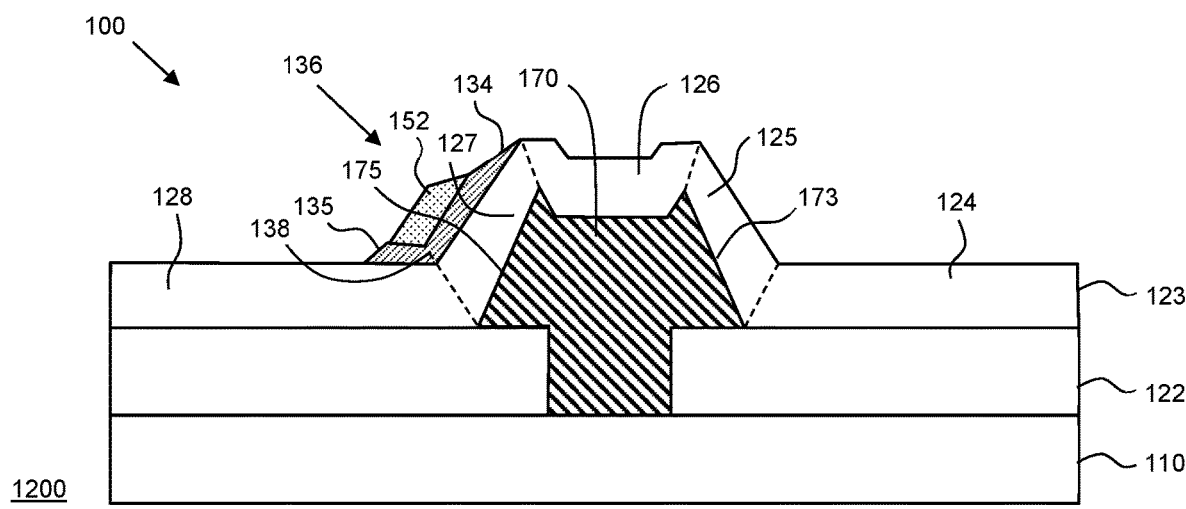

Referring next to step 220 and FIG. 12, which represents the same cross-section as shown in FIG. 11, during an optional next stage of fabrication 1200, a process of removing the above-mentioned second portion of the field plate 136 (i.e., the portion of the field plate 136 proximate the source-side of the gate electrode 170 that does not underlie the conductive strap 144) may be performed. This optional process may be desired, for example, to reduce parasitic gate-source capacitance by reducing the overall area of the field plate 136. According to an embodiment, the second portion of the field plate 136 that does not underlie the conductive strap 144 may be removed using a photoresist pattern to protect the desired first portion of the field plate 136 on the drain-side of the gate electrode 170 during a subsequent etching process, while removing the second portion of the field plate 136 on the source-side of the gate electrode 170.

According to the above-described processes, the portions of the first conductive layer 130 under the sidewall spacers 151, 152 thus form a field plate 136 which is completely self-aligned to the gate electrode 170. Because the length of the field plate 136 may be determined by the dimensions of the sidewall spacers 151, 152, which in turn are determined by the thickness of the sacrificial dielectric layer 150 and other parameters of the sidewall spacer process, both the position and length of the field plate 136 are independent of any lithographic limitations.

The conductive strap(s) 144 are electrically connected both to the field plate 136 and to the source electrode 163, in an embodiment, but are insulated from the gate by portions 124 and 126 of the first dielectric layer 123. Slight misalignment of the straps 144 should have no impact on the length or connectivity of the field plate 136. Thus, the above-described process may be considered to be a robust, manufacturable process.

Referring next to step 222, additional processing steps may be performed to complete the device 100, including the deposition and patterning of additional dielectric and metal layers. More specifically, and referring again to FIG. 1A, the additional fabrication steps may include depositing a second dielectric layer 154 over the first interconnect metal layer 140. The second dielectric layer 154 is then patterned to form openings (not numbered) in the second dielectric layer 154 that expose those portions of the first interconnect metal layer 140 that contact the source and drain electrodes 163, 166. Additional openings (not illustrated) also are formed in the second dielectric layer 154 to facilitate electrical connection to the gate electrode 170.

A second interconnect metal layer 145 is then deposited over the second dielectric layer 154. The second interconnect metal layer 145 may include an adhesion layer and a conductive layer in contact with the adhesion layer, in some embodiments. The second interconnect metal layer 145 is then patterned so that separate portions of the second interconnect metal layer 145 are electrically coupled to each of the source electrode 163, the drain electrode 166, and the gate electrode 170 through the openings in the first and second dielectric layers 123, 154.

One of those portions of the second interconnect metal layer 145 is electrically coupled to and extends from the source electrode 163 to the portion of the upper surface 112 of the substrate 110 over the isolation region 153. The backside of the substrate 110 is then thinned to produce the lower surface 111, and TSV 180 is created by forming an opening that extends from the lower surface 111 of the substrate 110 up to the upper surface 112 of the substrate 110, terminating at the upper surface 112 and exposing the portion 164 of the second interconnect metal layer 145 present over the isolation region 153. The back metal layer 184 is then deposited over the lower surface 111 and into the TSV 180, resulting in a physical and electrical connection at the innermost end of the TSV 180 between the back metal layer 184 and the portion 164 of the second interconnect metal layer 145 that is coupled to the source electrode 163. Accordingly, the source electrode 163 and the field plate 136 are electrically coupled to the back metal layer 184.

An embodiment of a transistor device includes a semiconductor substrate with an upper surface, and a gate structure at the upper surface of the substrate. The gate structure is non-planar and includes a metal gate electrode with a first sidewall and a second sidewall. A first dielectric layer is present over the gate structure, which includes a first portion that overlies the first sidewall and a second portion that overlies the second sidewall. A first conductive layer over the first dielectric layer includes a first conductive material, and a portion of the first conductive layer forms a field plate with a first portion proximate to the second sidewall of the metal gate electrode. A first dielectric sidewall spacer on the first portion of the field plate is formed from a portion of a second dielectric layer, and the first dielectric sidewall spacer does not contact the first dielectric layer.

An embodiment of a method of fabricating a transistor device includes providing a substrate that includes an upper surface, and forming a gate structure at the upper surface of the substrate. The gate structure includes a metal gate electrode with a first sidewall and a second sidewall. The method further includes depositing a first dielectric layer over the gate structure, where the first dielectric layer includes a first portion that overlies the first sidewall and a second portion that overlies the second sidewall. The method further includes depositing a first conductive layer over the first dielectric layer, where the first conductive layer comprises a first conductive material, and where the first conductive layer includes a first portion proximate to the first sidewall of the gate structure and a second portion proximate to the second sidewall of the gate structure. In addition, the method includes depositing a second dielectric layer over the first conductive layer, and performing an etching process to partially remove the second dielectric layer and the first conductive layer. The etching process produces a field plate formed from a remaining portion of the first conductive layer. The field plate includes a first portion proximate to the second sidewall of the gate structure. The etching process further produces a first dielectric sidewall spacer on the first portion of the field plate, where the first dielectric sidewall spacer is formed from a portion of the second dielectric layer, and the first dielectric sidewall spacer does not contact the first dielectric layer.

As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A transistor device comprising:
a semiconductor substrate with an upper surface;
a gate structure at the upper surface of the substrate, wherein the gate structure is non-planar and includes a metal gate electrode with a first sidewall and a second sidewall;
a first dielectric layer over the gate structure and including a first portion that overlies the first sidewall and a second portion that overlies the second sidewall;
a patterned first conductive layer on and in contact with the first dielectric layer, wherein the patterned first conductive layer comprises a first conductive material, and a portion of the patterned first conductive layer forms a field plate with a first portion proximate to the second sidewall of the metal gate electrode; and
a first dielectric sidewall spacer on and in contact with an upper surface of the first portion of the field plate, wherein the first dielectric sidewall spacer is formed from a portion of a second dielectric layer, and the first dielectric sidewall spacer does not contact the first dielectric layer.

2. The transistor device of claim 1, further comprising:
a second portion of the field plate proximate to the first sidewall of the metal gate electrode, wherein the first dielectric sidewall spacer does not contact the second portion of the field plate.

3. The transistor device of claim 2, further comprising:
a second dielectric sidewall spacer on the second portion of the field plate, wherein the second dielectric sidewall spacer does not contact the first portion of the field plate.

4. The transistor device of claim 1, further comprising:
an etch stop material at a surface of the first dielectric layer, wherein the etch stop material is characterized by a lower etch rate than the first conductive layer and the second dielectric layer.

5. The transistor device of claim 1, wherein the first conductive material of the patterned first conductive layer includes one or more materials selected from a group consisting of titanium tungsten (TiW), titanium tungsten nitride (TiWN), and tungsten silicide (WSi).

6. The transistor device of claim 1, further comprising:
a first current-carrying electrode at the upper surface of the substrate, wherein the first current-carrying electrode is spaced apart from the first sidewall of the gate structure; and
a patterned interconnect metal layer over the patterned first conductive layer, wherein a portion of the patterned interconnect metal layer forms a conductive strap that is electrically coupled to the first current-carrying electrode and to the first portion of the field plate.

7. The transistor device of claim 6, wherein:
the gate structure further includes an upper surface extending between the first and second sidewalls;
the patterned first conductive layer includes a portion proximate to the upper surface of the gate structure, which electrically couples the first portion of the field plate to the patterned interconnect metal layer and to the first current-carrying electrode; and
the conductive strap also extends onto the portion of the patterned first conductive layer that is proximate to the upper surface of the gate structure.

8. The transistor device of claim 7, wherein the patterned first conductive layer is present under the conductive strap, but is not present over the upper surface of the gate electrode where the conductive strap is not present.

9. The transistor device of claim 6, wherein the patterned interconnect metal layer is formed from a second conductive material that is different from the first conductive material.

10. The transistor device of claim 9, wherein the second conductive material of the patterned interconnect metal layer includes one or more materials selected from a group consisting of titanium, nickel, gold, and platinum.

11. The transistor device of claim 6, wherein the patterned interconnect metal layer has a substantial etch selectivity relative to the patterned first conductive layer.

12. The transistor device of claim 6, wherein:
the transistor device further comprises a third dielectric layer on the conductive strap and the first dielectric sidewall spacer.

13. The transistor device of claim 1, wherein the gate structure further includes and a gate insulating layer overlying the metal gate electrode.

14. The transistor device of claim 1, wherein the gate structure further includes dielectric sidewall spacers adjacent to the first and second sidewalls of the metal gate electrode.

15. The transistor device of claim 1, further comprising:
a second current-carrying electrode at the upper surface of the substrate, wherein the second current-carrying electrode is spaced apart from the second sidewall of the gate structure.

16. The transistor device of claim 1, wherein the transistor device is a high electron mobility transistor.

17. A method of fabricating a transistor device, the method comprising:
providing a substrate that includes an upper surface;
forming a gate structure at the upper surface of the substrate, wherein the gate structure includes a metal gate electrode with a first sidewall and a second sidewall;
depositing a first dielectric layer over the gate structure, wherein the first dielectric layer includes a first portion that overlies the first sidewall and a second portion that overlies the second sidewall;
depositing a first conductive layer on and in contact with the first dielectric layer, wherein the first conductive layer comprises a first conductive material, and wherein the first conductive layer includes a first portion proximate to the first sidewall of the gate structure and a second portion proximate to the second sidewall of the gate structure;
depositing a second dielectric layer over the first conductive layer; and
performing an etching process to partially remove the second dielectric layer and the first conductive layer, wherein the etching process produces a field plate formed from a remaining portion of the first conductive layer, wherein the field plate includes a first portion proximate to the second sidewall of the gate structure, and wherein the etching process further produces a first dielectric sidewall spacer on and in contact with an upper surface of the first portion of the field plate, wherein the first dielectric sidewall spacer is formed from a portion of the second dielectric layer, and the first dielectric sidewall spacer does not contact the first dielectric layer.

18. The method of claim 17, further comprising:
during or after depositing the first dielectric layer, depositing an etch stop material at a surface of the first dielectric layer, wherein the etch stop material is characterized by a lower etch rate than the first conductive layer and the second dielectric layer.

19. The method of claim 17, further comprising:
forming a first current-carrying electrode at the upper surface of the substrate, wherein the first current-carrying electrode is spaced apart from the first sidewall of the gate structure; and
depositing an interconnect metal layer on the first conductive layer, wherein the interconnect metal layer comprises a second conductive material that is different from the first conductive material; and
patterning the interconnect metal layer to form a conductive strap that is electrically coupled to the first current-carrying electrode and to the first portion of the field plate.

20. The method of claim 19, wherein:
the first conductive material of the first conductive layer includes one or more materials selected from a group consisting of titanium tungsten (TiW), titanium tungsten nitride (TiWN), and tungsten silicide (WSi); and
the second conductive material of the interconnect metal layer includes one or more materials selected from a group consisting of titanium, nickel, gold, and platinum.

21. The method of claim 19, wherein the field plate further includes a second portion proximate to the first sidewall of the gate structure, wherein and the first dielectric sidewall spacer does not contact the second portion of the field plate.

22. The method of claim 21, further comprising:
removing the second portion of the field plate where the conductive strap is not present.

23. The method of claim 21, wherein the etching process further produces a second dielectric sidewall spacer on the second portion of the field plate, wherein the second dielectric sidewall spacer is formed from a portion of the second dielectric layer, and the second dielectric sidewall spacer does not contact the first portion of the field plate.

24. The method of claim 17, further comprising:
before depositing the first dielectric layer, forming or depositing a gate insulator layer over the metal gate electrode.

25. The method of claim 17, further comprising:
after forming the gate structure and before or after depositing the first dielectric layer, forming dielectric sidewall spacers adjacent to the first and second sidewalls of the metal gate electrode.

* * * * *